(12) United States Patent
Dewey, III et al.

(10) Patent No.: US 6,460,167 B1
(45) Date of Patent: Oct. 1, 2002

(54) EFFICIENT SYSTEM FOR MULTI-LEVEL SHAPE INTERACTIONS

(75) Inventors: L. William Dewey, III, Wappingers Falls, NY (US); Peter A. Habitz, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/559,800

(22) Filed: Apr. 27, 2000

(51) Int. Cl.[7] .............................................. G06F 17/50
(52) U.S. Cl. ......................................................... 716/4
(58) Field of Search ....................................... 716/1–21

(56) References Cited

U.S. PATENT DOCUMENTS

| | | | |
|---|---|---|---|
| 5,446,674 A | 8/1995 | Ikeda et al. ...................... | 716/5 |
| 5,452,224 A | 9/1995 | Smith, Jr. et al. ............... | 716/19 |
| 5,706,206 A | 1/1998 | Hammer et al. ................. | 716/4 |
| 5,761,080 A | 6/1998 | DeCamp et al. ................. | 716/5 |
| 5,831,870 A | 11/1998 | Folta et al. ...................... | 716/5 |
| 5,838,582 A | 11/1998 | Mehrotra et al. ............... | 716/5 |

OTHER PUBLICATIONS

N.P. van der Meijs, A.J. van Genderen, "An Efficient Finite Element Method for Submicron IC Capacitance Extraction", pp. 678–681, 1989.

*Primary Examiner*—Matthew Smith
*Assistant Examiner*—Thuan Do
(74) *Attorney, Agent, or Firm*—McGinn & Gibb, PLLC; Richard M. Kotulak, Esq.

(57) ABSTRACT

A structure and method for evaluating an integrated circuit design includes adding a superseding layer of the integrated circuit design over a previous layer of the integrated circuit structure, identifying database pointers for regions and edges within the superseding layer and the previous layer, removing database pointers for regions of the previous layer overlapped by the superseding layer, classifying the superseding layer and the previous layer as the previous layer, and repeating the method until all layers of the integrated circuit are evaluated.

21 Claims, 4 Drawing Sheets

EFFICIENT SYSTEM FOR MULTI-LEVEL SHAPE INTERACTIONS

BACKGROUND OF THE INVENTION

1. Field of the Invention

The present invention generally relates to the design of integrated circuits and more particularly to an improved system for accommodating overlapping and intersecting structures within integrated circuits.

2. Description of the Related Art

Integrated circuit structures are formed from many layers of patterned conductors within insulators. The patterns within the layers are shaped and positioned to form various electronic structures, such as capacitors, transistors, and conductive wires. The designs of the layers within the integrated circuits are tested on a simulator to determine if they will perform as the designer intended.

Simulation programs not only check to see if the devices will cooperate in the manner desired by the designer, but also check for potential errors, such as unintended electrical connections (e.g., shorts), unintended electrical gaps (e.g., opens), parasitic capacitance, etc.

However, conventional simulation programs test multiple levels of the integrated circuit design at the same time (e.g., trapezoidal planar decomposition). The present inventors realized that, when conductive structures overlap, the trapezoidal planar decomposition process sometimes creates unnecessary work, unnecessarily uses CPU processing time, and unnecessarily consumes other similar resources. The invention described below identifies potentially unnecessary calculations and eliminates these calculations, thereby making the simulation program more efficient.

SUMMARY OF THE INVENTION

It is, therefore, an object of the present invention to provide a structure and method for evaluating an integrated circuit design that includes adding a superseding layer of the integrated circuit design over a previous layer of the integrated circuit structure, identifying database pointers for regions and edges within the superseding layer and the previous layer, removing database pointers for regions of the previous layer overlapped by the superseding layer, classifying the superseding layer and the previous layer as the previous layer, and repeating the method until all layers of the integrated circuit are evaluated.

After the removing of the database pointers, the invention adds construction edges to complete broken shapes partially removed by the removing process. The database pointers point to specific locations within a database containing information regarding design information of specific ones of the edges and the regions. The superseding layer is preferably adjacent to the previous layer. After the removing of the database pointers, the invention simulates one or more aspects of the integrated circuit design using remaining ones of the database pointers. The removing of the database pointers reduces a computational burden of the simulating process. The edges and the regions are created by an overlay of the superseding level over the previous level.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

As discussed above, conventional trapezoidal planer decomposition techniques suffer from the disadvantage that they often perform unnecessary calculations, especially in the regions of overlapping conductive structures. The invention overcomes this problem and eliminates the unnecessary calculations by performing planar decomposition one level at time. Such planar decomposition eliminates edges/regions which are covered by edges in a succeeding level.

Figure 1:
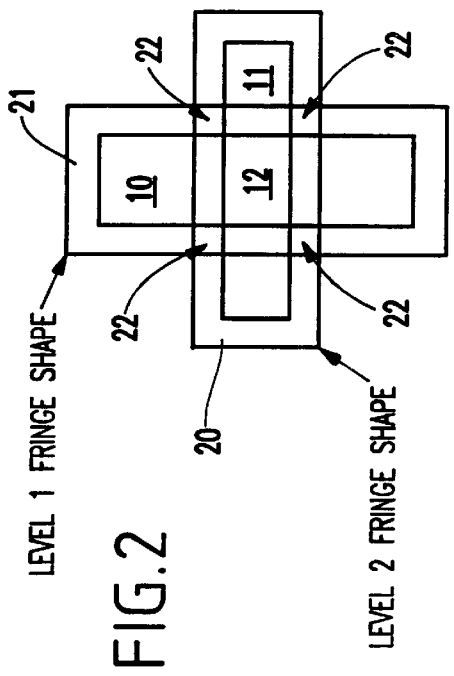
FIG. 1 is a schematic diagram of two intersecting conductive shapes on two different levels within an integrated circuit.

The invention will be described with reference to the accompanying drawings. More specifically, FIG. 1 illustrates a conductive shape 10 on a first level of the integrated circuit structure (a level 1 shape) and an intersecting conductive shape 11 on another level of the integrated circuit structure (a level 2 shape). The intersecting area is represented by item 12.

Figure 2:
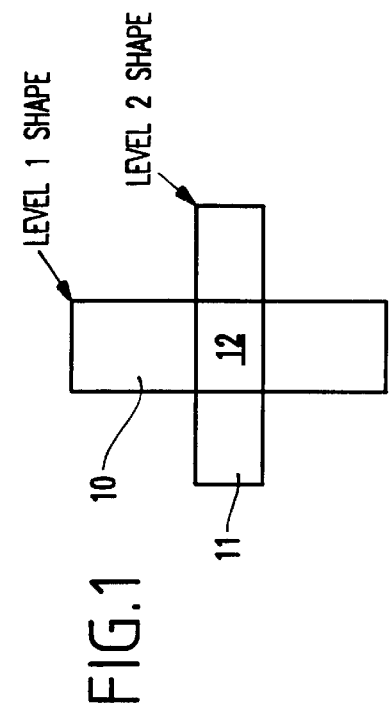
FIG. 2 is a schematic diagram of the structure shown in FIG. 1 with the addition of fringe shapes.

FIG. 2 is similar to FIG. 1 and illustrates conductive shapes 10 and 11. However, FIG. 2 also illustrates fringe shapes 21, 20 which are respectively referred to as level I fringe shape and level 2 fringe shape, respectively. The intersections of the fringes are shown as item 22 in FIG. 2. Such fringes 20, 21 can be added to various shapes by the simulation program for a number of purposes, such as ground rule checking, fringe capacitance extraction, thermal conduction calculations, etc.

Figure 3:
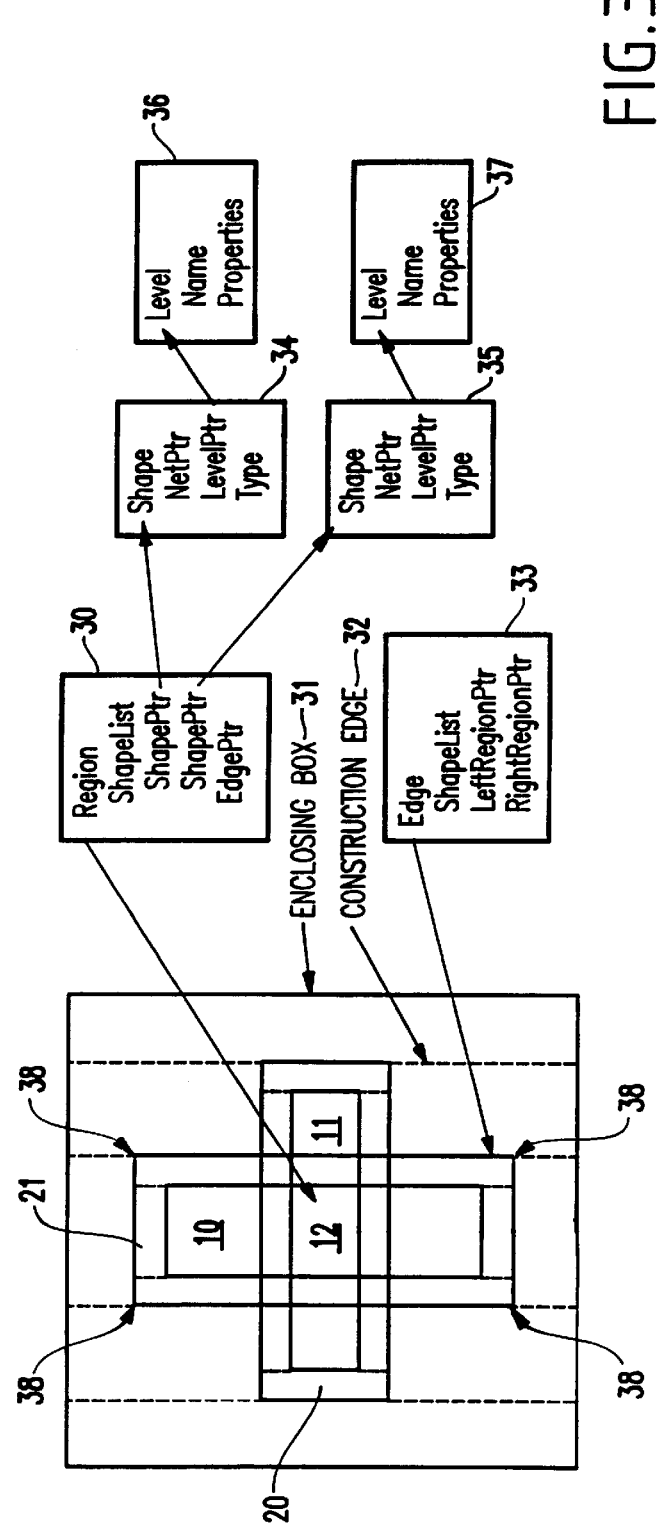
FIG. 3 is a schematic diagram of the structure shown in FIG. 2 with an enclosing box and FIG. 3 illustrates the various pointers utilized by the invention.

FIG. 3 illustrates a construction edge 32 and enclosing box 31 surrounding the structure shown in FIG. 2. The enclosing box 31 divides the overall circuit into sections that can be more easily simulated. The construction edges 32 are put in place to close any structures which are left open by the formation of the enclosing box 31.

FIG. 3 also illustrates the various pointers utilized by the invention. More specifically, within the overlap region 12 the invention creates a shape list (which is a list of various shape pointers) and identifies the edges which bound the region, as shown in item 30. Endpoints of an edge are contained in the edge information, item 33. As their name implies, the edge endpoints represent the ends of the edges of the various structures. For example, the edge endpoints of the outer edges of fringe shape 21 are shown as item 38 in FIG. 3.

Shape pointers are utilized by the invention to point directly to the portion of the database that represents the shape in question. Each shape will have been previously defined within a database by the designer. Conventional methods of shape interaction calculation copy such information for calculation purposes. To the contrary, the invention provides pointers that point to the information within the database, thereby eliminating the need to copy the information.

For example, the overlap area 12 would include at least two shape pointers, shown in item 30, that point to distinct areas within the database (shown as items 34 and 35). Within each of these database reference points 34, 35 is information regarding in the net pointer (e.g., identifying which network the shape 12 is located) the level pointer (e.g., level 1, level 2, etc.) and the type of shape (e.g. conductive, non conductive, etc.). FIG. 3 further illustrates an example of how the level pointer in each database 34, 35 would point to a different area within the database showing the level's name and it's properties 36, 37. In, addition, the region information 30 would include a pointer to information describing the edges of the region 12.

Item 33 is similar to item 30 and would include pointers to the database which relate to each edge within the structure. For example, the edge information 33 would include a similar shape list (as discussed above), a left region pointer pointing to database information regarding the region just to the left of the edge in question and a right region pointer, similarly pointing to the location within the database where the information regarding the region directly to the right of the edge is located. While only one region 12 and one and edge are discussed in FIG. 3, and as would be known by one ordinarily skilled in the art in light of this disclosure, each region and each edge is similarly evaluated by the invention.

Figure 4:
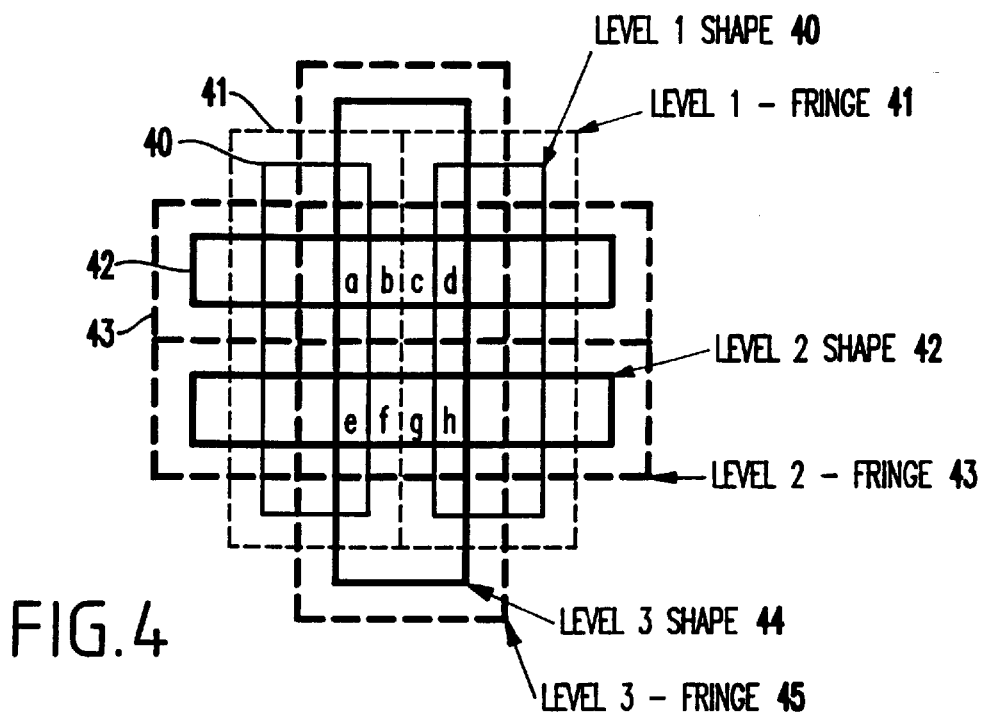
FIG. 4 is a schematic diagram illustrating three levels of intersecting shapes within an integrated circuit.

The invention's evaluation of two distinct levels is discussed above. In addition, the invention is very useful with multiple levels (e.g. three or more) of integrated circuit structure design. FIG. 4 illustrates such a structure which includes three levels of shapes 40, 42, 44 and associated fringe shapes 41, 43, 45. With conventional techniques, all regions and edges within the structure shown in FIG. 4 would be evaluated for the specific set of conditions the simulation program was testing (e.g., capacitance, spacing rules, etc.). Therefore, the conventional technique would check the database for regions a-h. However, calculations for such regions are unnecessary because regions a-h will eventually be covered with overlying shapes in succeeding levels. Conventional systems retrieve the database information before deciding whether the information would be eliminated (e.g., blocked by overlying shapes).

Figures 5, 6:
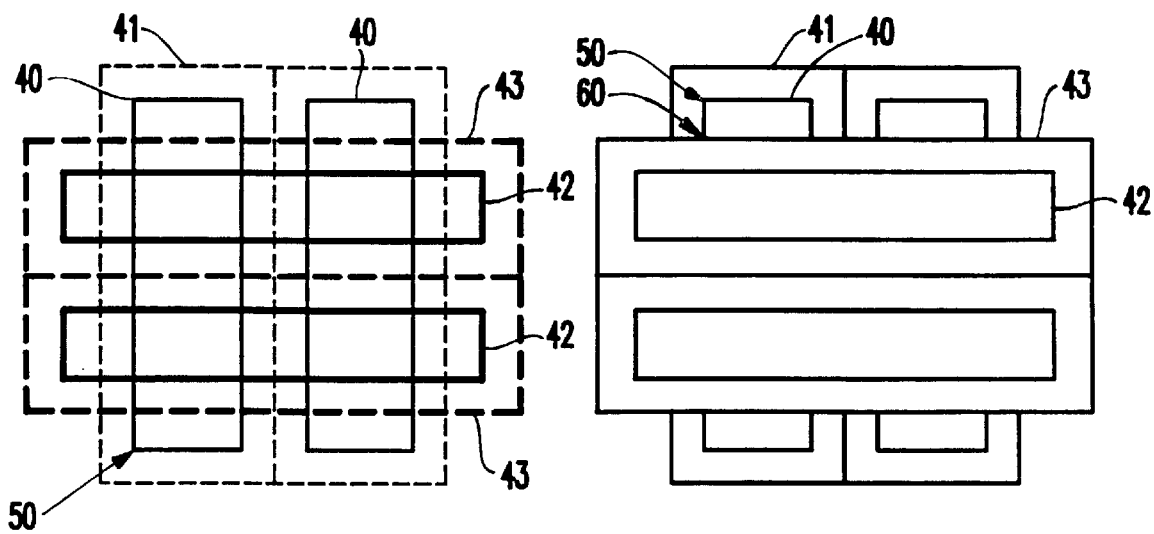
FIG. 5 is a schematic diagram illustrating two intersecting shapes on different levels within an integrated circuit.
FIG. 6 is a schematic diagram of illustrating the elimination of overlapping edges within the intersecting shapes shown in FIG. 5.

The invention avoids the need for such unnecessary calculations, as discussed below. The invention performs planar decomposition one level at a time. Therefore, FIG. 5 illustrates only level 1 (shapes 40, 41) and level 2 (shapes 42, 43). The invention creates the shape lists and edge pointers for the various regions and edges of the structure shown in FIG. 5 without including any information regarding level 3 shown in FIG. 4. Then, the invention determines which edges and regions will be overlapped by the succeeding level, as shown in FIG. 6. More specifically, the database pointers relating to the regions and edges which are hidden from view in FIG. 6 are eliminated from the decomposition. This process eliminates any searches of the database that are not necessary and significantly reduces the size of the database.

Figure 7:
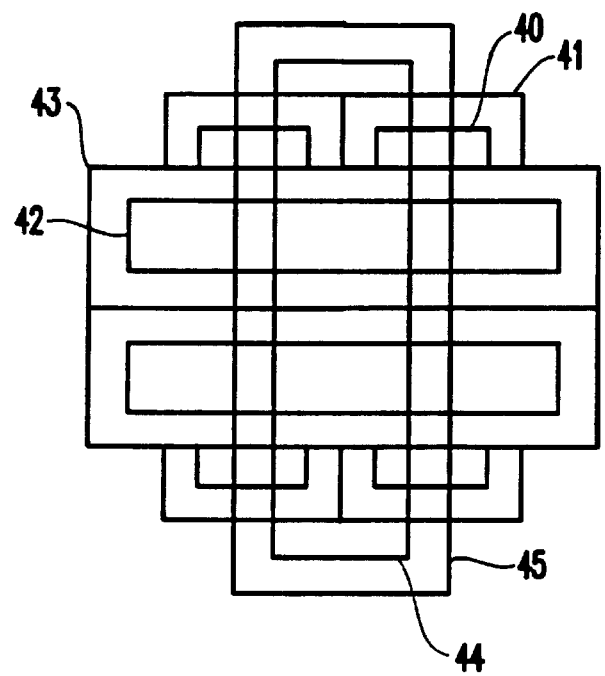
FIG. 7 is a schematic diagram illustrating the structure shown in FIG. 6 with an additional intersecting level.
Figure 8:
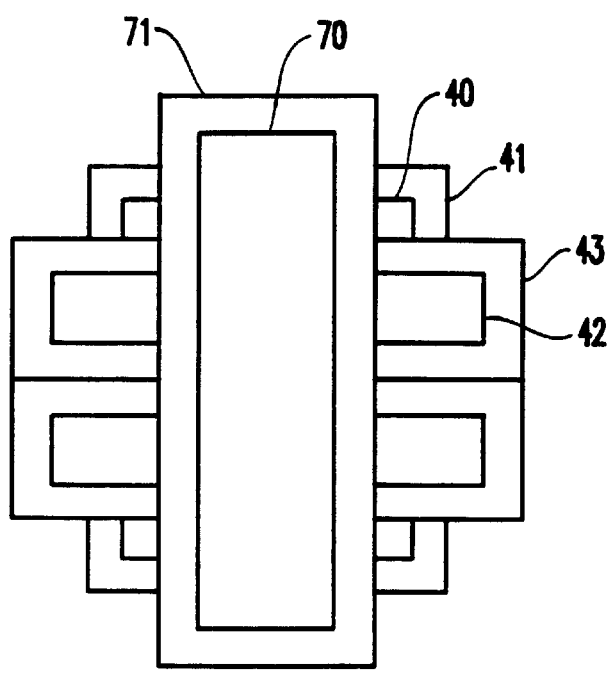
FIG. 8 is a schematic diagram of illustrating the elimination of overlapping edges within the intersecting shapes shown in FIG. 7.

Then, as shown in FIG. 7, after the foregoing database pointers are eliminated, the next level (shapes of 44, 45) is added to the structure shown in FIG. 6 (e.g., the combined structure of level 1 and level 2). Next, the additional shape pointer information is identified by the invention and the shapes which are determined to be overlapping are again eliminated from the list of pointers, as shown in FIG. 8.

Figure 9:
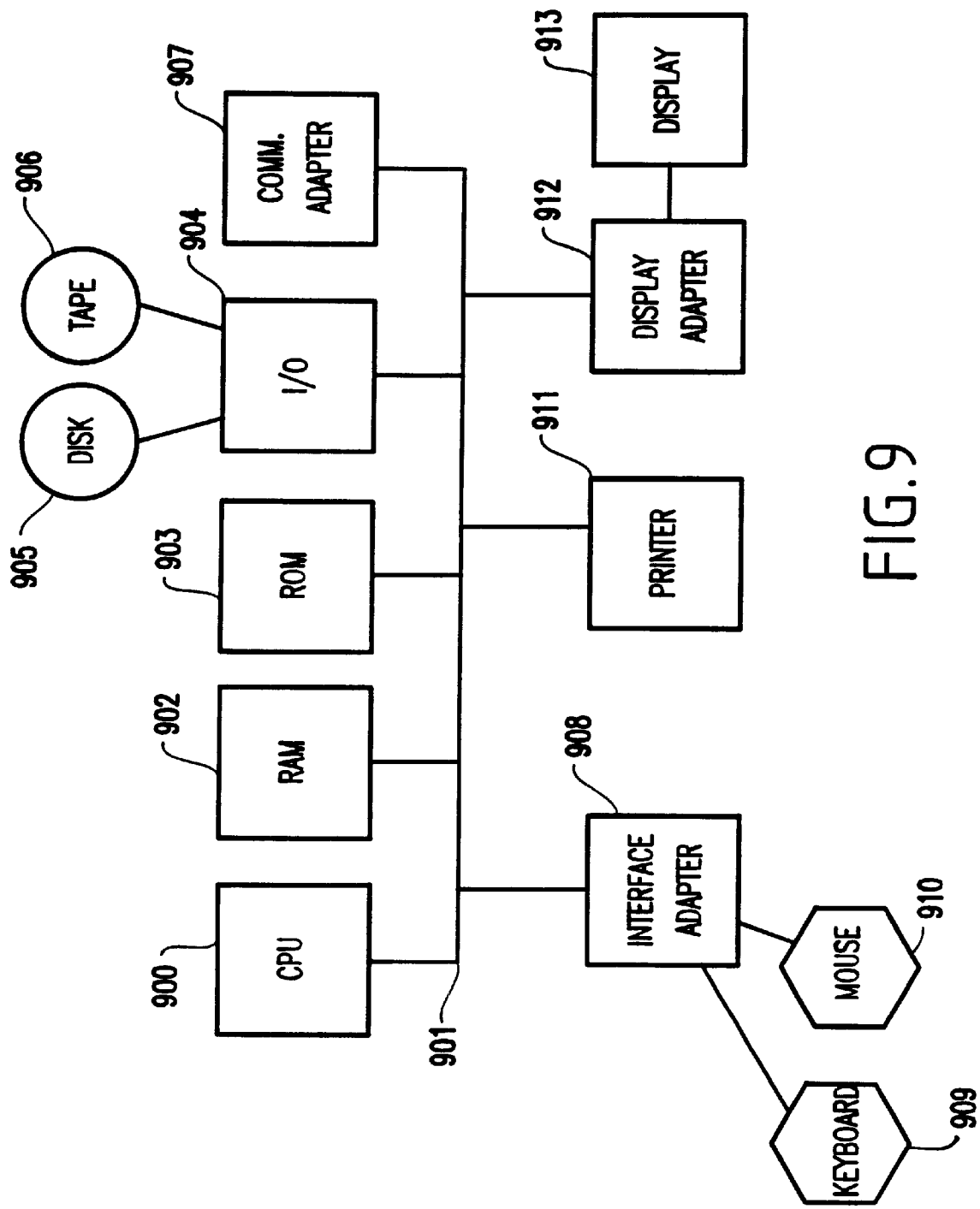
FIG. 9 is a schematic diagram of a hardware embodiment of the invention.

While the overall methodology of the invention is described above, the invention can be embodied in any number of different types of systems and executed in any number of different ways, as would be known by one ordinarily skilled in the art. For example, as illustrated in FIG. 9, a typical hardware configuration of an information handling/computer system in accordance with the invention preferably has at least one processor or central processing unit (CPU) 900. For example, the central processing unit 900 could include various image/texture processing units, mapping units, weighting units, classification units, clustering units, filters, adders, subtractors, comparators, etc. Alternatively, as would be known by one ordinarily skilled in the art given this disclosure, multiple specialized CPU's (or other similar individual functional units) could perform the same processing, mapping, weighting, classifying, clustering, filtering, adding, subtracting, comparing, etc.

The CPU 900 is interconnected via a system bus 901 to a random access memory (RAM) 902, read-only memory (ROM) 903, input/output (I/O) adapter 904 (for connecting peripheral devices such as disk units 905 and tape drives 906 to the bus 901), communication adapter 907 (for connecting an information handling system to a data processing network) user interface adapter 908 (for connecting a peripherals 909–910 such as a keyboard, mouse, imager, microphone, speaker and/or other interface device to the bus 901), a printer 911, and display adapter 912 (for connecting the bus 901 to a display device 913). The invention could be implemented using the structure shown in FIG. 9 by including the inventive method, described above, within a computer program stored on the storage device 905. Such a computer program would act on information supplied through the interface units 909–910 or through the network connection 907. The system would then automatically model the multi-layered structure and output the same on the display 913, through the printer 911 or back to the network 907.

The invention uses extension shapes to improve the functional operation of the invention. More specifically, extension shapes are added to prevent gaps from appearing between closely spaced structures. Such closely spaced structures have fringe capacitance shapes which overlap between the structures and provide screening of the next level. Therefore, by considering the fringe characteristics surrounding shapes, many of the shapes will join, thereby eliminating many edges, regions and corners from having to be retrieved from the database. The use of such extension shapes allows larger blocks of shapes to cover more consecutive area and block more of the underlying shapes, again reducing the number of searches of the database needed.

In a preferred embodiment, the invention begins at the lowest level of the integrated circuit being analyzed and progresses upwardly, one level at a time by adding the next adjacent level to the structure formed in the previous calculation. However, the invention can perform analysis on levels that are not adjacent to one another. Further, the invention can process an unlimited number of levels in that the calculations are simplified by the edition of a single level to the previously calculated structure.

Therefore, the invention described above reduces the number of unnecessary calculations performed by the simulation program by removing pointers to database shape information. The removal of the database pointers prevents the simulation program from performing a calculation on that information within the database.

Further, unlike typical Boolean shape processing programs, the invention always refers to original shapes. Therefore, there are no additional temporary levels that need to be created. Conventionally, Boolean shaped processing creates a separate level at region 12 (illustrated in FIG. 1) in addition to the level 1 and level 2 process (e.g., third level). Further, conventional shape processing programs also form the compliment of the third level 12. Both operations are eliminated with the invention because the invention processes one level at a time and covers the intersecting shape.

When performing parasitic capacitance calculations, the invention takes advantage of the shielding nature of capacitive coupling. By processing the levels in order, one level at a time, the invention eliminates calculations which are made unnecessary by the shielding of the capacitive coupling by the overlapping structures.

While the invention has been described in terms of preferred embodiments, those skilled in the art will recognize that the invention can be practiced with modification within the spirit and scope of the appended claims.

What is claimed is:

1. A method of evaluating an integrated circuit design comprising:

adding a superseding layer of said integrated circuit design over a previous layer of said integrated circuit design;

identifying database pointers for regions and edges within said superseding layer and said previous layer;

removing database pointers for regions of said previous layer overlapped by said superseding layer;

classifying said superseding layer and said previous layer as said previous layer; and repeating said method until all layers of said integrated circuit are evaluated.

2. The method in claim 1, wherein said database pointers point to specific locations within a database containing information regarding specific ones of said edges and said regions.

3. The method in claim 1, wherein said superseding layer is adjacent to said previous layer.

4. The method in claim 1, further comprising, after said removing of said database pointers, simulating one or more aspects of said integrated circuit design using remaining ones of said database pointers.

5. The method in claim 4, wherein said removing of said database pointers reduces a computational burden of said simulating process.

6. The method in claim 1, wherein said edges and said regions are created by an overlay of said superseding level over said previous level.

7. The method in claim 1, wherein said repeating process builds a model of said integrated circuit design one level at a time.

8. A method of evaluating an integrated circuit design comprising:

adding a superseding layer of said integrated circuit design over a previous layer of said integrated circuit design to create an ordered set of layers;

forming a model of said integrated circuit design using said previous layer and said superceding layer of said set of layers;

identifying database pointers for regions and edges within said previous layer and said superseding layer, removing database pointers for regions of said previous layer blocked by said superseding layer; and adding additional layers of said set of layers to said model until all layers of said integated circuit are evaluated.

9. The method in claim 8, wherein said database pointers point to specific locations within a database containing information regarding specific ones of said edges and said regions.

10. The method in claim 8, wherein said previous layer is adjacent to said superseding layer.

11. The method in claim 8, further comprising, after said removing of said database pointers, simulating one or more aspects of said integrated circuit design using remaining ones of said database pointers.

12. The method in claim 11, wherein said removing of said database pointers reduces a computational burden of said simulating process.

13. The method in claim 8, wherein said edges and said regions are created by an overlay of said previous level over said superseding level.

14. The method in claim 8, wherein said repeating process builds said model one level at a time.

15. A program storage device readable by machine, tangibly embodying a program of instructions executable by the machine to perform a method of evaluating an inserted circuit design comprising adding adding a superceding layer of said integrated circuit design over a previous layer of said integrated circuit design to create an ordered set of layers;

forming a model of said integrated circuit design using said previous and said superceding layer of said set of layer, identifying database pointers for regions and edges within said previous layer and said superseding layer;

removing database pointers for regions of said previous layer blocked by said superseding layer; and adding additional layers of said set of layers to said model until all layers of said integrated circuit are evaluated.

16. The program storage device in claim 15, wherein said database pointers point to specific locations within a database containing information regarding specific ones of said edges and said regions.

17. The program storage device in claim 15, wherein said previous layer is adjacent to said superseding layer.

18. The program storage device in claim 15, wherein said method further comprises, after said removing of said database pointers, simulating one or more aspects of said integrated circuit design using remaining ones of said database pointers.

19. The program storage device in claim 15, wherein said removing of said database pointers reduces a computational burden of said simulating process.

20. The program storage device in claim 15, wherein said edges and said regions are created by an overlay of said previous level over said superseding level.

21. The program storage device in claim 15, wherein said repeating process builds said model one level at a time.

* * * * *